US010741226B2

(12) United States Patent
Huppenthal et al.

(10) Patent No.: US 10,741,226 B2
(45) Date of Patent: Aug. 11, 2020

(54) MULTI-PROCESSOR COMPUTER ARCHITECTURE INCORPORATING DISTRIBUTED MULTI-PORTED COMMON MEMORY MODULES

(71) Applicant: Saint Regis Mohawk Tribe, Akwesasne, NY (US)

(72) Inventors: Jon M. Huppenthal, Colorado Springs, CO (US); Timothy J. Tewalt, Larkspur, CO (US); Lee A. Burton, Divide, CO (US); David E. Caliga, Fort Worth, TX (US)

(73) Assignee: FG SRC LLC, Dallas, TX (US)

( * ) Notice: Subject to any disclaimer, the term of this patent is extended or adjusted under 35 U.S.C. 154(b) by 488 days.

(21) Appl. No.: 13/903,720

(22) Filed: May 28, 2013

(65) Prior Publication Data
US 2014/0359199 A1    Dec. 4, 2014

(51) Int. Cl.
| G11C 7/10 | (2006.01) |
| G06F 3/06 | (2006.01) |
| G06F 12/02 | (2006.01) |
| G06F 15/173 | (2006.01) |
| G11C 11/406 | (2006.01) |

(52) U.S. Cl.
CPC .......... *G11C 7/1075* (2013.01); *G06F 3/0604* (2013.01); *G06F 3/0644* (2013.01); *G06F 3/0689* (2013.01); *G06F 12/0246* (2013.01); *G06F 15/17331* (2013.01); *G11C 11/40615* (2013.01)

(58) Field of Classification Search
None
See application file for complete search history.

(56) References Cited

U.S. PATENT DOCUMENTS

| 4,942,517 A | 7/1990 | Cok |
| 5,121,498 A * | 6/1992 | Gilbert et al. ............... 717/149 |

(Continued)

FOREIGN PATENT DOCUMENTS

| JP | 03-261255 | 11/1991 |
| WO | 2006115896 A2 | 11/2006 |

OTHER PUBLICATIONS

Notice of Reasons for Rejection reference Japanese Patent Application No. 2014-089473 with English translation, dated Aug. 26, 2014, original and translation 4 pages each.

(Continued)

*Primary Examiner* — Henry Tsai
*Assistant Examiner* — Christopher A Bartels
(74) *Attorney, Agent, or Firm* — Todd R. Fronek; Larkin Hoffman Daly & Lindgren Ltd.

(57) ABSTRACT

A multi-processor computer architecture incorporating distributed multi-ported common memory modules wherein each of the memory modules comprises a control block functioning as a cross-bar router in conjunction with one or more associated memory banks or other data storage devices. Each memory module has multiple I/O ports and the ability to relay requests to other memory modules if the desired memory location is not found on the first module. A computer system in accordance with the invention may comprise memory module cards along with processor cards interconnected using a baseboard or backplane having a toroidal interconnect architecture between the cards.

27 Claims, 3 Drawing Sheets

(56) References Cited

U.S. PATENT DOCUMENTS

| | | | |
|---|---|---|---|
| 5,278,966 A | 1/1994 | Parks et al. | |
| 6,026,459 A | 2/2000 | Huppenthal | |
| 6,076,152 A | 6/2000 | Huppenthal et al. | |
| 6,247,110 B1 | 6/2001 | Huppenthal et al. | |
| 6,266,289 B1* | 7/2001 | Dubovik | G11C 11/06035 |
| | | | 365/171 |
| 6,295,598 B1 | 9/2001 | Bertoni et al. | |
| 6,356,983 B1 | 3/2002 | Parks | |
| 6,883,108 B2* | 4/2005 | Lee | H04L 45/00 |
| | | | 710/38 |
| 6,961,841 B2 | 11/2005 | Huppenthal et al. | |
| 6,964,029 B2 | 11/2005 | Poznanovic et al. | |
| 7,003,593 B2 | 2/2006 | Huppenthal et al. | |
| 7,124,211 B2 | 10/2006 | Dickson et al. | |
| 7,155,602 B2 | 12/2006 | Poznanovic | |
| 7,167,976 B2 | 1/2007 | Poznanovic | |
| 7,237,091 B2 | 6/2007 | Huppenthal et al. | |
| 7,299,458 B2 | 11/2007 | Hammes | |
| 7,620,800 B2 | 11/2009 | Huppenthal et al. | |
| 7,703,085 B2 | 4/2010 | Poznanovic et al. | |
| 7,890,686 B2 | 2/2011 | Conner | |
| 9,160,607 B1* | 10/2015 | Froese | H04L 12/2602 |
| 2003/0065969 A1 | 4/2003 | Lee et al. | |
| 2004/0167421 A1* | 8/2004 | Gregory et al. | 600/547 |
| 2006/0028469 A1* | 2/2006 | Engel | 345/426 |
| 2006/0041715 A1 | 2/2006 | Chrysos et al. | |
| 2006/0098478 A1* | 5/2006 | Ezaki | B82Y 10/00 |
| | | | 365/158 |
| 2006/0155883 A1* | 7/2006 | Chou et al. | 710/3 |
| 2007/0162709 A1 | 7/2007 | Arataki et al. | |
| 2008/0222303 A1* | 9/2008 | Archer | G06F 9/546 |
| | | | 709/238 |
| 2009/0006546 A1* | 1/2009 | Blumrich | G06F 15/16 |
| | | | 709/204 |
| 2009/0006808 A1* | 1/2009 | Blumrich | G06F 15/17337 |
| | | | 712/12 |
| 2009/0007141 A1* | 1/2009 | Blocksome | G06F 15/17356 |
| | | | 719/315 |
| 2009/0094436 A1* | 4/2009 | Deng et al. | 712/11 |
| 2010/0153676 A1* | 6/2010 | Kawamura | H03K 19/17728 |
| | | | 711/170 |
| 2010/0211715 A1* | 8/2010 | Huang et al. | 710/314 |
| 2011/0219208 A1* | 9/2011 | Asaad | G06F 15/76 |
| | | | 712/12 |
| 2012/0095607 A1* | 4/2012 | Wells et al. | 700/291 |
| 2013/0239121 A1* | 9/2013 | Rossi | G06F 15/17343 |
| | | | 718/106 |
| 2014/0047156 A1* | 2/2014 | Billi | 710/314 |
| 2014/0359199 A1* | 12/2014 | Huppenthal | G06F 3/0644 |
| | | | 711/103 |

OTHER PUBLICATIONS

Australian Government IP Australia; Patent Examination Report No. 1 for Patent Application No. 2014202193; dated Jun. 10, 2015; 5 pages.

European Patent Office; partial European Search Report for Patent Application No. 14166932.5-1957 2808802; dated Jun. 22, 2015, 5 pages.

Canadian First Office Action for Application No. 2,849,576 dated Sep. 23, 2015, 3 pages.

Extended European Search Report for Application No. 14166932.5 dated Oct. 20, 2015, 11 pages.

* cited by examiner

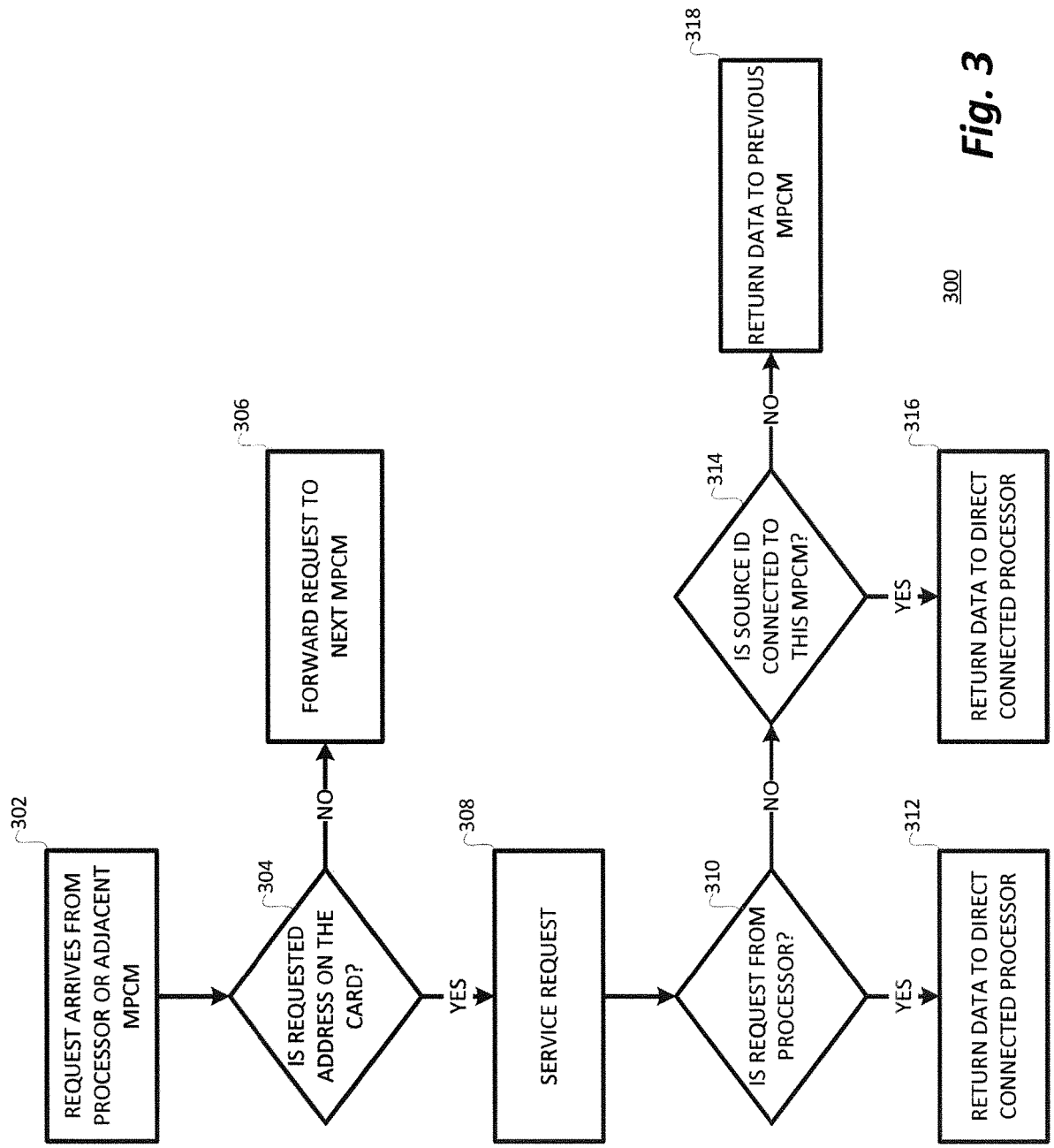

MULTI-PROCESSOR COMPUTER ARCHITECTURE INCORPORATING DISTRIBUTED MULTI-PORTED COMMON MEMORY MODULES

BACKGROUND OF THE INVENTION

The present invention relates, in general, to the field of multi-processor based computer systems. More particularly, the present invention relates to a multi-processor computer architecture incorporating distributed multi-ported common memory (MPCM) modules, each comprising a control block functioning as a cross-bar router in conjunction with one or more associated memory banks or other data storage devices.

In computer systems it is often desirable to allow multiple processors to have access to a single, large shared common memory. Historically, this has necessitated a physically large assembly in order to reach memory capacity in excess of 1 TByte. Some conventional systems attempt to decrease the physical size of the memory by distributing it among numerous processor boards and then employing one of several software protocols, such as the Message Passing Interface (MPI), to allow all of the processors to access all of the memory. The problem with such methodologies is that they exhibit very high memory access latencies and consume significant processing power just to effectuate sharing of the data.

The foregoing approach is not in line with the current market trends toward low processing power microprocessors situated on small physical footprint circuit boards to enable very dense packaging.

SUMMARY OF THE INVENTION

SRC Computers, LLC, assignee of the present invention, has pioneered numerous innovations in the field of multi-processor and reconfigurable computing systems including those disclosed in at least the following U.S. Pat. Nos.: 6,026,459; 6,076,152; 6,247,110; 6,295,598; 6,356,983; 6,961,841; 6,964,029; 7,003,593; 7,124,211; 7,155,602; 7,167,976; 7,237,091; 7,299,458; 7,620,800, 7,703,085 and 7,890,686. The disclosures of the foregoing patents are herein specifically incorporated by this reference in their entirety.

Disclosed herein is a multi-processor computer architecture incorporating distributed multi-ported common memory modules which overcomes the limitations of conventional multi-processor based computer systems. As disclosed herein, each of the multi-ported common memory modules in accordance with the present invention comprises a control block functioning as a cross-bar router in conjunction with one or more associated memory banks or other data storage devices. The system memory architecture of the present invention is readily scalable and inherently amenable to small board form factors using even relatively low performance or "wimpy" node microprocessors such as those employed in the Fast Arrays of Wimpy Nodes (FAWN) architecture.

Broadly, what is disclosed herein is a method for creating a shared common memory utilizing more than one memory card having multiple I/O ports and the ability to relay requests to other memory cards if the desired memory location is not found on the first card. The control function on the memory card may be advantageously implemented with a Field Programmable Gate Array (FPGA), Application Specific Integrated Circuit (ASIC), Complex Programmable Logic Device (CPLD), Programmable Logic Device (PLD), Customer Specific Standard Product (CSSP) or Programmable System-on-Chip (PSoC) and similar devices. In a representative embodiment of the present invention, a computer system is disclosed comprising memory cards along with processor cards which are interconnected using a baseboard or backplane having a toroidal interconnect architecture between the cards.

In addition to the representative toroidal interconnect topology disclosed herein, it should be noted that other chassis interconnect techniques may also be employed without departing from the teaching and scope of the present invention. Further, all extant toroidal based interconnect systems, for example the Paragon system available from Intel Corporation and the Cray Research T3D system, require a specialized toroid interface chip to be located at each of the intersections of the toroid to which the processors are then connected. The ports of the multi-ported common memory modules of the present invention to not require these specialized interface chips and instead, allow for the direct coupling of the processors and multi-ported common memory modules.

Further disclosed herein is a method for creating a non-shared memory utilizing more than one memory card having multiple I/O ports and the ability to relay requests to other memory cards if the desired memory location is not found on the first card. As noted above, the control function on the memory card may be conveniently implemented with an FPGA, ASIC, CPLD, PLD, CSSP, PSoC or other comparable programmable device.

A computer system in accordance with the present invention facilitates the rapid replacement of a portion of the memory by distributing it across several smaller cards. In a representative embodiment, the memory storage on the memory cards may comprise semiconductor memory such as SDRAM, Flash memory, disk drive based storage or can be implemented in another type of data storage technology.

Particularly disclosed herein is a multi-processor computer system which comprises N processor cards with each of the processor cards being affixed in an array of N processor card slots and M multi-ported common memory modules with each of the multi-ported common memory modules being affixed in an array of M memory module card slots. The N processor card slots and the M memory module card slots are toroidally interconnected and wherein N is an integer greater than 1.

Also particularly disclosed herein is a method for processing data requests from an array comprising a plurality of interconnected processors and memory modules. The method comprises directing a data request to a first one of the memory modules and servicing the data request if the data resides on the first one of memory modules, otherwise the first memory module directs the data request to a second adjacent one of the memory modules. The method further comprises returning the data requested to a direct coupled processor if the data request originated with one of the processors, otherwise returning the data requested to a direct coupled one of the plurality of processors if a source ID of the data request is associated with the servicing one of the memory modules, otherwise returning the data requested to a previous one of the memory modules.

Further particularly disclosed herein is a multi-processor computer system which comprises a plurality of processor blocks and a multiplicity of multi-ported common memory modules. Processor ports of the memory modules are each associated with a corresponding one of the processor blocks and the memory modules are operational to relay memory access requests from a first one of the processor blocks directed to a corresponding first one of the memory modules to another one of the multiplicity of memory modules if a requested memory location is not found on the first one of the memory modules.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 3 is an exemplary logical flow chart illustrative of a possible packet processing and routing cycle as may be implemented by the controller block in the multi-ported common memory module of FIG. 1.

DESCRIPTION OF A REPRESENTATIVE EMBODIMENT

Figure 1:
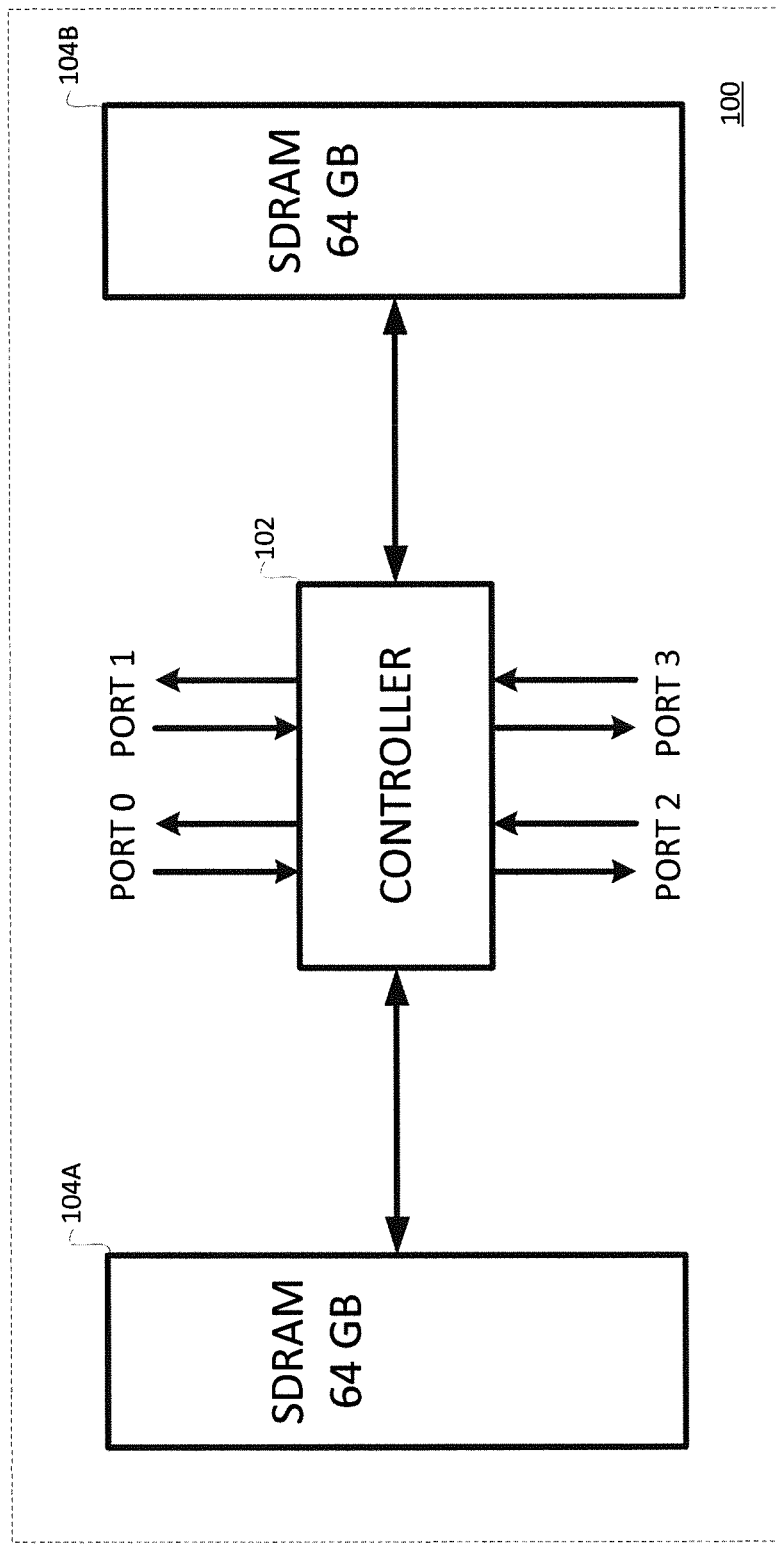
FIG. 1 is a functional block diagram of a representative embodiment of a multi-ported common memory module in accordance with the present invention illustrative of an exemplary four-ported implementation.

With reference now to FIG. 1 a functional block diagram of a representative embodiment of a multi-ported common memory module 100 in accordance with the present invention illustrative of an exemplary four-ported implementation is shown. The memory module 100 illustrated incorporates a four-ported controller block 102 and associated memory banks 104A and 104B although it should be noted that other numbers of ports can be provided by the controller block 102. The multi-ported common memory module 100 may be conveniently provided in a relatively small footprint card form factor for insertion in a computer baseboard or backplane as will be more fully described hereinafter.

The multi-ported common memory module 100 is designed to be utilized as a portion of a representative multi-processor computer architecture in accordance with that aspect of the present invention. As illustrated and described, a representative embodiment of the multi-ported common memory module may be conveniently implemented as a four port device. The multi-ported common memory module 100 controller block 102 functions as a cross bar router in conjunction with one or more memory banks 104A, 104B (such as SDRAM) or alternative storage such as Flash memory, disk drives and the like. The controller block 102 functionality may be conveniently implemented in a Field Programmable Gate Array (FPGA), Application Specific Integrated Circuit (ASIC), Complex Programmable Logic Device (CPLD), Programmable Logic Device (PLD), Customer Specific Standard Product (CSSP) or Programmable System-on-Chip (PSoC) and similar devices.

As a practical matter, given currently available memory device technology and device form factors, the only limitation on the total number of memory banks 104 which may be incorporated on a given sized card, (or the total amount of memory provided) is the specific physical size of the card itself. In an exemplary embodiment the card may be approximately 5 inches by 7 inches when using utilizing Double Data Rate 3 (DDR3) Synchronous Dynamic Random Access Memory (SDRAM) devices. This card form factor allows for the provision of two memory banks each with 64 GBytes of SDRAM given the current state of memory or storage technology. As memory devices evolve to provide even greater bit density, this storage capacity can be increased.

Figure 2:
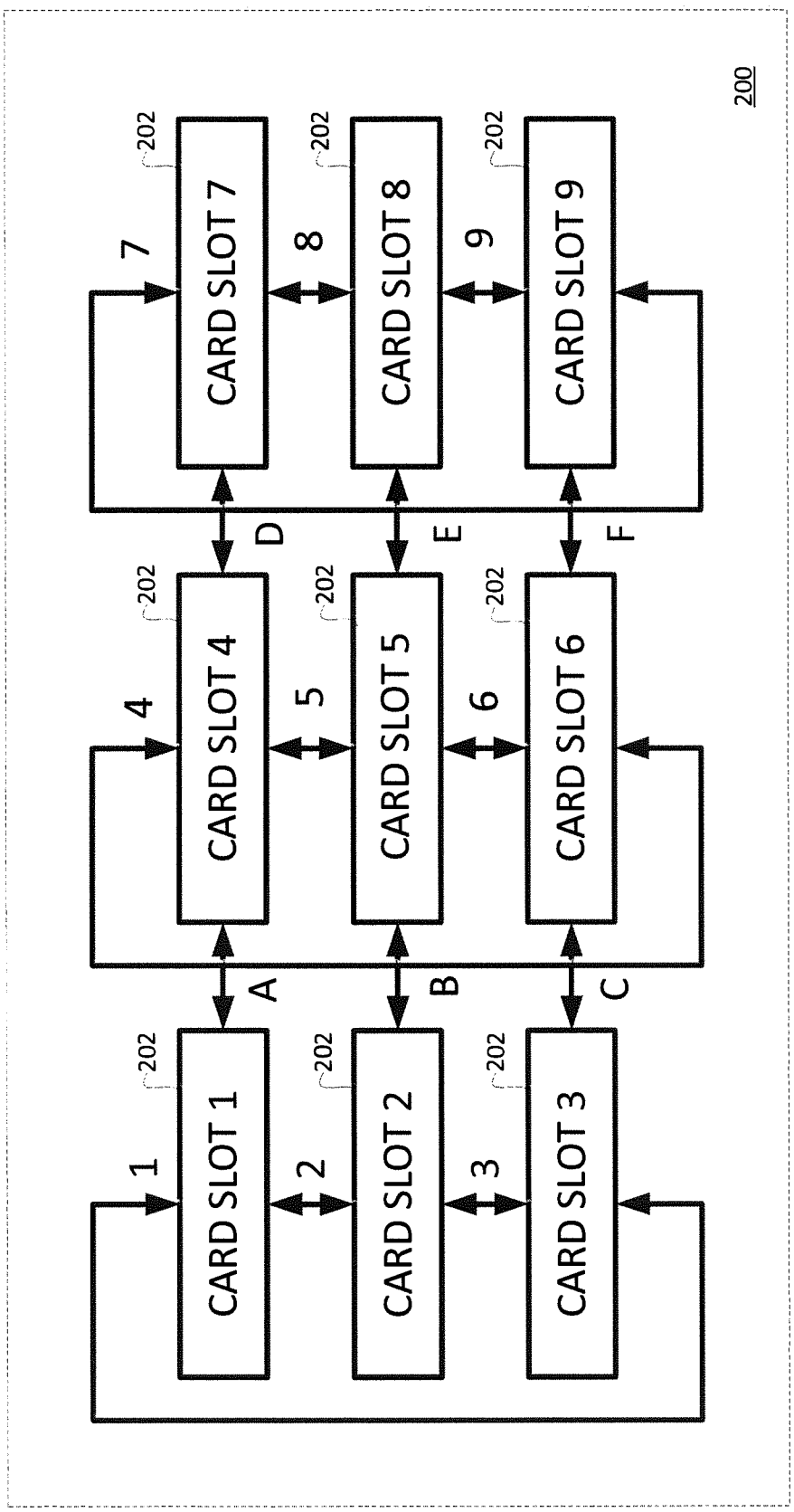
FIG. 2 is a further functional block diagram of a representative implementation of a multi-processor computer architecture in accordance with the present invention comprising a baseboard, or backplane, with provisions for the insertion of a number of multi-ported common memory module cards as illustrated in the preceding figure in conjunction with a number of processor cards coupled in a toroidal interconnect topology.

With reference additionally now to FIG. 2 a further functional block diagram of a representative implementation of a multi-processor computer architecture 200 in accordance with the present invention is shown. The multi-processor computer architecture 200 comprises a baseboard, or backplane, with provisions for the insertion of a number of multi-ported common memory module 100 cards as illustrated in the preceding figure in conjunction with a number of processor cards coupled in a toroidal interconnect topology through a number card slots 202. In this configuration, the processor cards and the multi-ported common memory module 100 cards can each communicate with its adjacent processor cards and multi-ported common memory module 100 cards as shown.

The performance of the overall multi-processor computer architecture design of the present invention can be increased or decreased based on the performance level of the interconnecting paths A through F and 1 through 9. In the representative embodiment illustrated, each of these interconnect paths may comprise a pair of unidirectional paths with a first path transferring data in one direction and a second path transferring data in the opposite direction. In this manner, data collisions can be minimized for read data being returned to a requesting processor card. While the multi-processor computer architecture 200 shown illustrates a 9 card slot example it will be appreciated that a greater or lesser number of card slots may be employed without departing from the spirit and teachings of the present invention.

The interconnect topology illustrated comprises a toroidal configuration and is known and well understood in the computer industry. The exact interconnect protocol which may be employed however, is not critical but should desirably exhibit as low a latency as possible and have a bandwidth substantially compatible with the bandwidth available from any one memory bank 104 (FIG. 1) to prevent the interconnect itself from limiting the system performance as with traditional input/output (I/O) based MPI.

Given the representative topology illustrated in FIG. 2, it may be desirable for each multi-ported common memory module 100 card to have four I/O ports as shown in FIG. 1. In this example system, processor cards would be populated into slots 1, 2, 3, 7, 8, and 9 while multi-ported common memory module 100 cards are placed in slots 4, 5 and 6. With respect to the multi-ported common memory modules 100 in this exemplary system, paths A, B, C, D, E and F may be denominated processor ports and paths 4, 5 and 6 denominated as memory module ports. The number of processor cards in the exemplary architecture 200 corresponds to the number of processor ports available in the multi-ported common memory modules 100 and the number of memory modules 100 themselves need not be the same.

In this representative implementation, the basic mode of operation would be as follows. Considering the processor in card slot 1 as an example initiator, it makes a memory reference in a first direction over path A to the memory array 104 in the multi-ported common memory module 100 in card slot 4. Since in this case, the multi-ported common memory module 100 card in card slot 4 only contains ⅓ of the total memory available in the overall system, there is a 33.3% chance that the address will be found on that particular module. If the memory reference is within the address range of the module in card slot 4, the memory transaction is serviced by the memory controller 102 on that multi-ported common memory module 100. If the memory reference is a "read" the read data is then returned to the processor in card slot 1 via the reverse direction over data path A.

On the other hand, if the pertinent address is not within the address range allocated to the multi-ported common memory module in card slot 4, the controller 102 in that module will route the request to its nearest adjacent memory array 104 in the multi-ported common memory module 100 in card slot 5 via path 5. In the multi-ported common memory module in card slot 5 the previous process may then be repeated until the request arrives at the appropriate multi-ported common memory module 100 memory array 104 where it can be serviced.

The foregoing example has been described implemented in a "clockwise" routing scheme where memory packets move, for example, through card slots 4,5 and then 6. As is apparent, a "counter clockwise" routing could also be used wherein packets flow through the system in the reverse direction.

Each memory request, or "packet", will contain a memory address and a source identification (ID). This ID is decoded by the router circuit in the multi-ported common memory module 100 controller 102 (FIG. 1) in a similar fashion as the memory address so that "read" data can be returned to the requester if its location was not on the memory module that is directly connected to the requesting processor.

With reference additionally now to FIG. 3 an exemplary logical flow chart illustrative of a possible packet processing and routing cycle is shown as may be implemented by the controller 102 block in the multi-ported common memory module of FIG. 1.

The packet processing and routing cycle 300 begins as step 302 wherein a request arrives from either a processor or an adjacent multi-ported common memory module 100. If the requested address does not reside on the multi-ported common memory module 100 at decision step 304, the request is then forwarded on to the next multi-ported common memory module at step 306. Otherwise, the request is serviced at step 308 and then, at decision step 310, if the request has come from a processor, then the data is returned to the direct connected processor at step 312.

Otherwise, if the request at decision step 310 has not come from a processor, a determination is made at decision step 314 whether or not the source of the request is connected to this particular multi-ported common memory module 100. If it is, then the data is returned to the direct connected processor at step 316. Otherwise, the data is returned to the previous multi-ported common memory module 100 at step 318.

This method of operation allows multiple processors to each access a large pool of shared memory without requiring that the memory all reside in one assembly and without the use of a large crossbar switch assembly.

Functionally, it is desirable that the controller 102 on each multi-ported common memory module 100 have minimal latency and that the protocol utilized is relatively simple to again minimize latency. Inasmuch as these criteria may result in a non-standard protocol being utilized, an FPGA may be the most desirable controller solution. However if manufacturing volumes of multi-ported common memory modules 100 were sufficiently high, implementing the controller 102 function an ASIC may be a cost effective alternative.

A major feature of the system architecture of the present invention is that since the controller 102 incorporates the intelligence to analyze memory packets, it then also has the intelligence to perform non-traditional memory accesses, thus making the data arriving back at the processor much more efficiently organized. This then results in much improved processing throughput. Such functionality can be readily incorporated into the controller 102 if, for example, an FPGA is utilized as the controller 102 since such functions can easily be added or subtracted.

An example of such an additional function is that of matrix transposition. When performing signal processing on an array it is often desirable to perform a Fast Fourier Transform (FFT) operation, transpose the output matrix, and then perform another FFT operation. In a traditional memory system the output of the first FFT operation is stored in rows in the memory. However the second FFT operation must access that same data by column in order to perform the transposition. Due to the nature of SDRAM type memory, this column access cannot be performed by simple addressing. As a result, the processor will conventionally have to read back the entire array and then access individual pieces of it in order to create each columnar element, which is then processed. This is inherently time consuming and prevents the use of modern stream processing techniques.

In accordance with the present invention, it is also possible to incorporate the ability to transpose this matrix data into the memory controller 102 itself. As a result, the data returned to the processor arrives in a sequence that is ready to process and streaming processing techniques can then be employed. Such specialized data access patterns may be invoked by the incorporation of simple Direct Memory Access (DMA) requests and appropriate parameters into the packet header where the processor ID is located. Along these lines, many different memory access functions can also readily be incorporated such as sub-volume access to arrays, gather-scatter and linked lists to name a few.

As further examples only, the functionality of the controller 102 can be implemented to: return two-dimensional (2D) data in transpose order; return 2D sub-volumes out of a larger 2D set of data return 2D planes out of three-dimensional (3D) volumes; and return 3D sub-volumes out of a larger 3D volume. Further, the controller 102 can also be configured to implement gather-scatter DMA operations in order to provide a list of addresses and constant lengths for read/write accesses as well as to provide a list of addresses and lengths for such read/writes. Still further, the controller 102 can implement linked list DMS operations providing the ability to follow a linked list set of addresses to the final set of data read.

In still other possible implementations of the present invention, the controller 102 can also function to return records of an unknown length. In this manner, the controller 102 is operational to provide some intelligence of record formats so that a DMA operation could read a "record" at a given address. The length of the record would then be determined by reading the record and the data could be returned in a vector stream that contains the record length in the header.

Moreover, the controller 102 can also implement and return the address of where the data is written which is essential to daisy-chained Global Console Manager (GCM) devices available from IBM Corporation. For example, if multiple nodes write data into the "column" of data, it would be advantageous to have the ability to issue the write operation and return the address of where the data was written to the memory. This would then enable a node to write beyond the memory of the GCM directly attached to the compute node.

While there have been described above the principles of the present invention in conjunction with a specific multi-processor computer architecture and exemplary multi-ported common memory modules, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A multi-processor computer system comprising:
    N processor cards, each of said processor cards being affixed in an array and including a process to generate memory requests having a memory address and a source identifier; and
    M multi-ported common memory modules allocated with an address range configured to be accessed by any of the N processor cards based on the memory requests, each of said multi-ported common memory modules being affixed in an array, wherein each M multi-ported common memory modules include a controller and a plurality of memory storage devices accessible by the controller, each controller including a processor port and a memory module port;
    said N processor cards and said M multi-ported common memory modules being toroidally interconnected such that the processor port for each M multi-ported common memory module is connected to one of said N processor cards such that the controller receives memory requests and executes said memory requests with respect to the plurality of storage devices if the memory address is within the address range associated with the controller and said memory module port for each M multi-ported common memory module is connected to relay memory requests to one of said M multi-ported common memory modules if the memory address is not within the address range associated with the controller, and wherein N is an integer greater than 1.

2. The multi-processor computer system of claim 1 further comprising:
    an additional N processor cards, each of said additional processor cards being affixed in the array, said additional N processor cards being toroidally interconnected to said M multi-ported common memory modules.

3. The multi-processor computer system of claim 1 wherein N≥3.

4. The multi-processor computer system of claim 1 wherein each of said M multi-ported common memory modules comprises four ports.

5. The multi-processor computer system of claim 1 wherein said controller comprises at least one of an FPGA, ASIC, CPLD, PLD, CSSP or PSoC.

6. The multi-processor computer system of claim 1 wherein said at least one memory storage device comprises a memory array comprising at least one SDRAM device.

7. The multi-processor computer system of claim 1 wherein said at least one memory storage device comprises Flash memory or a disk drive.

8. The multi-processor computer system of claim 1 wherein said arrays of processor card slots and memory module card slots comprises a portion of either a baseboard or backplane.

9. A method for processing data requests from an array comprising a plurality of interconnected processors and memory controllers, said method comprising:
    directing a data request having a memory address and a source identifier to a first port of a first one of said plurality of memory controllers from a first of the plurality of interconnected processors;
    if said memory address resides within an address range associated with said first one of said plurality of memory controllers:
        servicing said data request with the first one of said plurality of memory controllers by accessing a first memory storage device associated with the memory address; and
        returning said data requested within the address range to said first of the plurality of interconnected processors using the first port of said first one of said plurality of memory controllers based on the source identifier;
    otherwise:
        directing said data request to a second adjacent one of said plurality of memory controllers using a second port of said first one of said plurality of memory controllers;
        servicing said data request with said second adjacent one of said plurality of memory controllers by accessing a second memory storage device associated with the memory address;

returning said data requested using said second adjacent one of said plurality of memory controllers to said second port of said first one of said plurality of memory modules; and returning said data requested using said first port of said first one of said plurality of memory controllers to said first of the plurality of interconnected processors based on the source identifier, wherein said plurality of interconnected processors are configured to access the first memory storage device and the second memory storage device based on the data request.

10. The method of claim 9 wherein said plurality of processors and memory controllers are toroidally interconnected.

11. The method of claim 9 wherein each of said plurality of processors and memory controllers are located on respective cards for insertion into corresponding card slots in a backplane.

12. The method of claim 9 wherein each of said plurality of processors and memory controllers are located on respective cards for insertion into corresponding card slots in a baseboard.

13. A multi-processor computer system comprising:
a plurality of processor blocks, each block generating memory address requests having a memory address and a source identifier; and
a multiplicity of multi-ported common memory modules allocated with an address range configured to be accessed by any of the plurality of processor blocks based on the memory address requests, each multi-ported common memory module having a controller and a plurality of memory storage devices, a processor port of the controller of each of said memory modules being associated with a corresponding one of said processor blocks, said memory modules being operational to relay memory access requests from a first one of said processor blocks directed to a corresponding first one of said memory modules to another one of said multiplicity of memory modules using a memory module port if a requested memory location is not found on said first one of said memory modules and returning accessed data using the processor port.

14. The multi-processor computer system of claim 13 wherein said another one of said multiplicity of memory modules is adjacent said first one of said memory modules.

15. The multi-processor computer system of claim 13 wherein said plurality of processor blocks and said multiplicity of multi-ported common memory modules are toroidally interconnected.

16. The multi-processor computer system of claim 13 wherein a control function of each of said multiplicity of multi-ported common memory modules is carried out by at least one of an FPGA, ASIC, CPLD, PLD, CSSP or PSoC.

17. The multi-processor computer system of claim 13 wherein said plurality of processor blocks and said multiplicity of multi-ported common memory modules each comprise respective card form factors for retention in corresponding card slots in a backplane.

18. The multi-processor computer system of claim 13 wherein said plurality of processor blocks and said multiplicity of multi-ported common memory modules each comprise respective card form factors for retention in corresponding card slots in a baseboard.

19. The multi-processor computer system of claim 13 wherein said multiplicity of multi-ported common memory modules comprises a shared common memory system for said plurality of processor blocks.

20. The multi-processor computer system of claim 13 wherein said multiplicity of multi-ported common memory modules comprises a non-shared common memory system for said plurality of processor blocks.

21. The multi-processor computer system of claim 13 wherein each of said multi-ported common memory modules comprise at least one of semiconductor or disk-based data storage devices.

22. The multi-processor computer system of claim 13 wherein said multi-ported common memory modules are operational to perform at least one of returning: 2D data in transpose order; 2D sub-volumes out of a larger 2D set of data; 2D planes out of 3D volumes; or 3D sub-volumes out of a larger 3D volume.

23. The multi-processor computer system of claim 13 wherein said multi-ported common memory modules are operational to perform gather-scatter DMA operations comprising at least one of providing for read/write operations a list of addresses and constant or a list of addresses and lengths.

24. The multi-processor computer system of claim 13 wherein said multi-ported common memory modules are operational to perform linked list DMA operations comprising following a linked list set of addresses to a final set of data read.

25. The multi-processor computer system of claim 13 wherein said multi-ported common memory modules are operational to return records of unknown length.

26. The multi-processor computer system of claim 25 wherein said length of said return records is determined by reading the record at a given address.

27. The multi-processor computer system of claim 13 wherein said multi-ported common memory modules are operational to return an address where data is written.

* * * * *